(12) United States Patent
Ohse et al.

(10) Patent No.: US 10,651,270 B2
(45) Date of Patent: May 12, 2020

(54) SEMICONDUCTOR DEVICE HAVING A TRENCH STRUCTURE (71) Applicant: FUJI ELECTRIC CO., LTD., Kawasaki-shi, Kanagawa (JP)

(72) Inventors: Naoyuki Ohse, Matsumoto (JP); Yusuke Kobayashi, Tsukuba (JP); Shinsuke Harada, Tsukuba (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/854,540

(22) Filed: Dec. 26, 2017

(65) Prior Publication Data

US 2018/0204905 A1 Jul. 19, 2018

(30) Foreign Application Priority Data

Jan. 16, 2017 (JP) ................. 2017-005471

(51) Int. Cl.
*H01L 29/06* (2006.01)
*H01L 29/16* (2006.01)
*H01L 29/78* (2006.01)
*H01L 29/66* (2006.01)
*H01L 29/10* (2006.01)
(Continued)

(52) U.S. Cl.
CPC .......... *H01L 29/063* (2013.01); *H01L 21/046* (2013.01); *H01L 29/0623* (2013.01); *H01L 29/0878* (2013.01); *H01L 29/1095* (2013.01); *H01L 29/1608* (2013.01); *H01L 29/4236* (2013.01); *H01L 29/66068* (2013.01);
(Continued)

(58) Field of Classification Search
CPC ............. H01L 29/7813; H01L 29/1608; H01L 29/1095; H01L 29/0878; H01L 29/66734; H01L 29/4236; H01L 29/7397; H01L 29/063; H01L 29/0623; H01L 21/046
USPC ........... 257/330, 77, 331, E29.066, E29.201; 438/270–272
See application file for complete search history.

(56) References Cited

U.S. PATENT DOCUMENTS 6,342,709 B1 * 1/2002 Sugawara ........... H01L 29/0619
257/139
2011/0024831 A1 2/2011 Nakano
(Continued)

FOREIGN PATENT DOCUMENTS

JP 2009-260253 A 11/2009

*Primary Examiner* — Mohammed Shamsuzzaman
*Assistant Examiner* — Aaron J Gray
(74) *Attorney, Agent, or Firm* — Rabin & Berdo, P.C.

(57) ABSTRACT

In a semiconductor device having a first $p^+$-type base region, a second $p^+$-type base region, a high-concentration n-type region selectively formed in an n-type silicon carbide epitaxial layer on an $n^+$-type silicon carbide substrate; a p-type base layer formed on the n-type silicon carbide epitaxial layer; an $n^+$-type source region and a $p^{++}$-type contact region selectively formed in a surface layer of the p-type base layer; and a trench formed penetrating the p-type base layer and shallower than the second $p^+$-type base region, in at least a part of the first $p^+$-type base region, a region is shallower than the second $p^+$-type base region as viewed from an element front surface side.

5 Claims, 7 Drawing Sheets (51) Int. Cl.
　　　*H01L 29/08* 　　(2006.01)
　　　*H01L 29/423* 　(2006.01)
　　　*H01L 21/04* 　　(2006.01)

(52) U.S. Cl.
　　　CPC .... *H01L 29/66734* (2013.01); *H01L 29/7813* (2013.01); *H01L 29/0634* (2013.01)

(56) References Cited

U.S. PATENT DOCUMENTS

2016/0247910 A1* 　8/2016 　Suzuki .............. H01L 29/66068
2017/0141186 A1* 　5/2017 　Shiomi ............. H01L 29/66068
2018/0138264 A1* 　5/2018 　Kinoshita .......... H01L 29/7813

* cited by examiner

SEMICONDUCTOR DEVICE HAVING A TRENCH STRUCTURE

CROSS REFERENCE TO RELATED APPLICATIONS

This application is based upon and claims the benefit of priority of the prior Japanese Patent Application No. 2017-005471, filed on Jan. 16, 2017, the entire contents of which are incorporated herein by reference.

BACKGROUND OF THE INVENTION

1. Field of the Invention

Embodiments of the invention relate to a semiconductor device, such as a vertical MOSFET, containing a wide bandgap semiconductor material and having a trench structure. The embodiments further relate to a method of manufacturing such a semiconductor device.

2. Background of the Related Art

Among vertical MOSFETs as conventional switching devices, a trench-type in which the channel is formed orthogonal to the substrate surface enables the cell density per unit area to be increased as compared to a planar-type in which a channel is formed parallel to the substrate surface. As a result, the current density per unit area may be increased, which is advantageous in terms of cost.

Nonetheless, when a trench structure is adopted, the structure is such that the entire region inside the trench is covered by a gate oxide film to form the channel in the orthogonal direction and the trench bottom is exposed to an electrode on the drain side whereby high electric field tends to be applied to the gate oxide film. In particular, since ultra-high-voltage devices are produced using a wide bandgap semiconductor material, the impact on the gate oxide film at the trench bottom greatly affects reliability. For this reason, according to a prior art, a structure has been disclosed in which a p-type region is formed at a lower portion of the trench and positioned to be separated from the trench to mitigate the electric field strength at the trench bottom for a wide bandgap semiconductor (for example, refer to Japanese Laid-Open Patent Publication No. 2009-260253).

SUMMARY OF THE INVENTION

According to an embodiment of the present invention, a semiconductor device includes a first wide bandgap semiconductor layer of a first conductivity type and having a low concentration formed on a surface of a wide bandgap semiconductor substrate of the first conductivity type and having a high concentration; and an element structure formed in a region on the first wide bandgap semiconductor layer of the first conductivity type. The element structure includes a first base region of a second conductivity type selectively formed in a surface of the first wide bandgap semiconductor layer of the first conductivity type; a second base region of the second conductivity type selectively formed in the first wide bandgap semiconductor layer of the first conductivity type; a first-conductivity-type region selectively formed in the surface of the first wide bandgap semiconductor layer of the first conductivity type, the first-conductivity-type region having a concentration higher than that of the first wide bandgap semiconductor layer of the first conductivity type; a wide bandgap semiconductor layer of the second conductivity type formed on a surface of a first side of the first wide bandgap semiconductor layer of the first conductivity type, opposite a second side of the first wide bandgap semiconductor layer of the first conductivity type facing the wide bandgap semiconductor substrate a source region of the first conductivity type selectively formed in a surface layer of the wide bandgap semiconductor layer of the second conductivity type; a contact region of the second conductivity type; and a trench penetrating the wide bandgap semiconductor layer of the second conductivity type and formed shallower than the second base region. In at least a part of the first base region, a region is shallower than the second base region as viewed from an element front surface side.

In the embodiment, the first base region and the second base region have a same impurity concentration.

In the embodiment, the second base region contacts the first base region at a region of the first base region excluding a shallow region of the first base region.

In the embodiment, the wide bandgap semiconductor substrate contains silicon carbide.

In the embodiment, a width of the shallow region of the first base region is 0.2 μm to 1.9 μm.

In the embodiment, the semiconductor device further includes a gate insulating film formed along surfaces of the trench, at a bottom and sides of the trench, the first wide bandgap semiconductor layer of the first conductivity type and the wide bandgap semiconductor layer of the second conductivity type being insulated by the gate insulating film; a gate electrode, at least a part of which is formed in the trench; an interlayer insulating film formed on the gate electrode; a source electrode commonly contacting surfaces of the source region and the contact region; and a drain electrode formed on a rear surface of the wide bandgap semiconductor substrate.

According to another embodiment, a method of manufacturing a semiconductor device includes forming on a wide bandgap semiconductor substrate of a first conductivity type and having a high concentration, a first wide bandgap semiconductor layer of the first conductivity type and having a low concentration; selectively forming in a surface of the first wide bandgap semiconductor layer of the first conductivity type, a first region of a first base region of a second conductivity type and a second base region of the second conductivity type; forming a first region of a first-conductivity-type region, the first region formed deeper than the first region of the first base region and the second base region, from the surface of the first wide bandgap semiconductor layer of the first conductivity type; forming on the surface of the first wide bandgap semiconductor layer of the first conductivity type, a second wide bandgap semiconductor layer of the first conductivity type and having a low concentration; selectively forming a second region of the first base region of the second conductivity type from a surface side of the second wide bandgap semiconductor layer of the first conductivity type; selectively forming in the surface side of the second wide bandgap semiconductor layer of the first conductivity type, a second region of the first-conductivity-type region; forming a wide bandgap semiconductor layer of the second conductivity type on a surface of the second wide bandgap semiconductor layer of the first conductivity type; selectively forming a source region of the first conductivity in a surface of the wide bandgap semiconductor layer of the second conductivity type; forming a contact region of the second conductivity type in the surface of the wide bandgap semiconductor layer of the second conductivity type, the contact region formed so as to be adjacent to the source region; and forming a trench that penetrates the wide bandgap semiconductor layer of the second conductivity type where a part of the source region is in the surface of the wide bandgap semiconductor layer of the second conductivity type, the trench formed shallower than the second base region. The first region of the first base region is selectively formed at a predetermined interval whereby in at least a part of the first base region, a region is formed that is shallower than the second base region when viewed from an element surface side.

According to another embodiment, a method of manufacturing a semiconductor device includes forming in a wide bandgap semiconductor substrate of a first conductivity type and having a high concentration, a first wide bandgap semiconductor layer of the first conductivity type and having a low concentration; selectively forming a first region of a first base region of a second conductivity type and a second base region of the second conductivity type in a surface of the first wide bandgap semiconductor layer of the first conductivity type; forming a first region of the first-conductivity-type region, the first region formed deeper than the first region of the first base region and the second base region, from the surface of the first wide bandgap semiconductor layer of the first conductivity type; forming on the surface of the first wide bandgap semiconductor layer of the first conductivity type, a second wide bandgap semiconductor layer of the first conductivity type and having a high concentration; selectively forming a second region of the first base region from a surface side of the second wide bandgap semiconductor layer of the first conductivity type; forming a wide bandgap semiconductor layer of the second conductivity type on a surface of the second wide bandgap semiconductor layer of the first conductivity type; selectively forming a source region of the first conductivity type in a surface of the wide bandgap semiconductor layer of the second conductivity type; forming a contact region of the second conductivity type in the surface of the wide bandgap semiconductor layer of the second conductivity type, the contact region formed so as to be adjacent to the source region; and forming a trench that penetrates the wide bandgap semiconductor layer of the second conductivity type where a part of the source region is in the surface of the wide bandgap semiconductor layer of the second conductivity type, the trench formed shallower than the second base region. The first region of the first base region is selectively formed at a predetermined interval whereby in at least a part of the first base region, a region is formed that is shallower than the second base region when viewed from an element surface side.

In the embodiments, the first region of the first base region and the second base region are formed concurrently.

In the embodiments, the wide bandgap semiconductor substrate contains silicon carbide.

In the embodiments, the methods further include forming a gate insulating film on a bottom and sides of the trench; forming a gate electrode on the gate insulating film; forming an interlayer insulating film on the gate electrode; forming a source electrode on surfaces of the source region and the contact region; and forming a drain electrode on a rear surface of the wide bandgap semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

The structure described in Japanese Laid-Open Patent Publication No. 2009-260253 sets the width of the p-type region at the lower portion of the trench to be narrower than the width of the trench and as a result, high electric field tends to be applied to the sides of the trench and the high electric field applied to the ends of the trench bottom is not mitigated. Further, when the width of the p-type region at the lower portion of the trench is narrow with respect to a deep p-structure positioned separated from the trench, a large part of the avalanche current at time of breakdown flows to the trench bottom, degrading the gate oxide film at the trench bottom whereby the gate oxide film may be destroyed.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
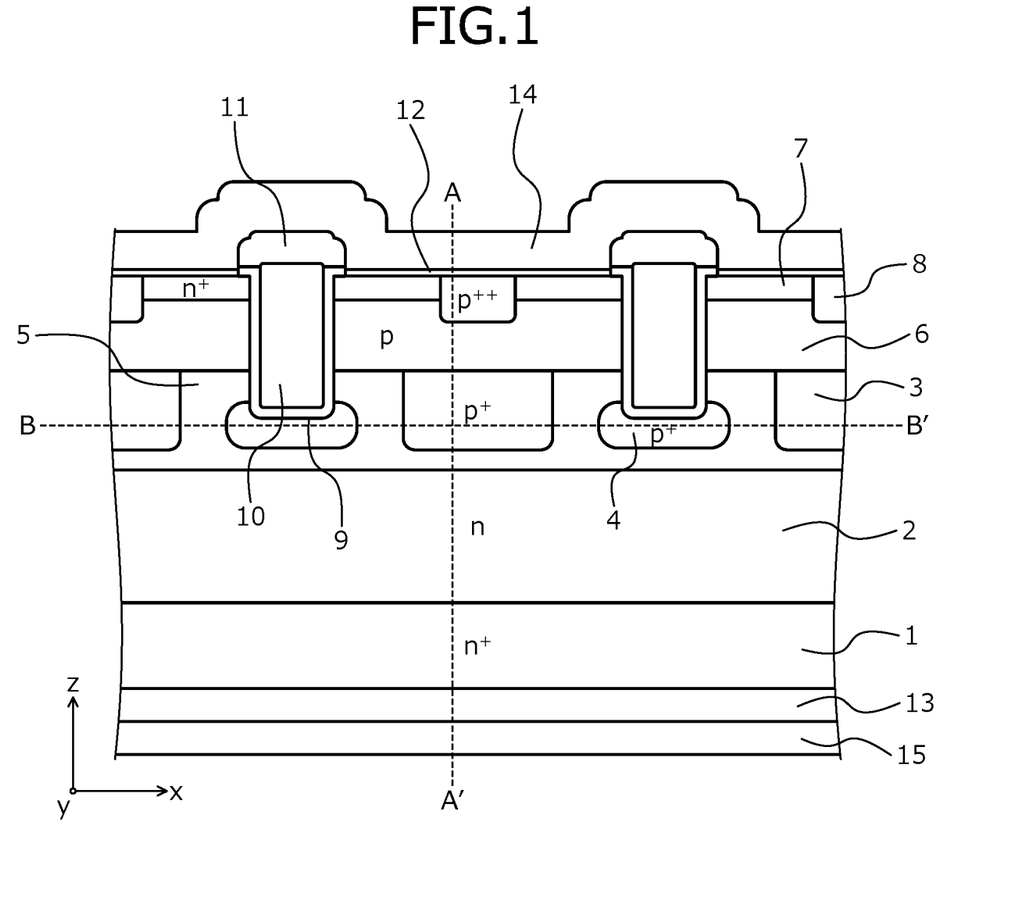
FIG. 1 is a cross-sectional view of a configuration of a silicon carbide semiconductor device according to an embodiment.

The semiconductor device according to the embodiment is configured using a wide bandgap semiconductor material. In the embodiment, a MOS will be described as an example regarding a silicon carbide semiconductor device produced using, for example, silicon carbide (SiC) as a wide bandgap semiconductor material. FIG. 1 is a cross-sectional view of a configuration of the silicon carbide semiconductor device according to the embodiment.

As depicted in FIG. 1, in the silicon carbide semiconductor device according to the embodiment, on a first main surface, e.g., (0001) plane (Si face), of an $n^+$-type silicon carbide substrate (wide bandgap semiconductor substrate) 1, an n-type silicon carbide epitaxial layer (wide bandgap semiconductor deposition layer) 2 is deposited.

The n$^+$-type silicon carbide substrate 1 is, for example, a silicon carbide single crystal substrate doped with nitrogen (N). The n-type silicon carbide epitaxial layer 2 has an impurity concentration that is lower than that of the n$^+$-type silicon carbide substrate 1 and, for example, is a low-concentration n-type drift layer doped with nitrogen. In the first main surface side of the n-type silicon carbide epitaxial layer 2, a high-concentration n-type region 5 having a high impurity concentration and doped with, for example, nitrogen, is formed. The impurity concentration of the high-concentration n-type region 5 is lower than that of the n$^+$-type silicon carbide substrate 1 and higher than that of the n-type silicon carbide epitaxial layer 2.

Hereinafter, the n$^+$-type silicon carbide substrate 1 alone, or the n$^+$-type silicon carbide substrate 1 and the n-type silicon carbide epitaxial layer 2, or the n$^+$-type silicon carbide substrate 1, the n-type silicon carbide epitaxial layer 2, and a p-type base layer 6 (described hereinafter) collectively are regarded as a silicon carbide semiconductor base.

As depicted in FIG. 1, on a surface (rear surface of the silicon carbide semiconductor base) of the n$^+$-type silicon carbide substrate 1, opposite the surface of the n$^+$-type silicon carbide substrate 1 facing the n-type silicon carbide epitaxial layer 2, a drain electrode 13 is provided. The drain electrode 13 is constituted by a rear electrode.

In a first main surface side of the silicon carbide semiconductor base, a trench structure is formed. In particular, a trench penetrates the p-type base layer 6 from a surface on a first side (first main surface side of the silicon carbide semiconductor base) of the p-type base layer 6, opposite a second side of the p-type base layer 6 facing toward the n$^+$-type silicon carbide substrate 1. Along the surface of the trench, a gate insulating film 9 is formed on the bottom and sides of the trench. A gate electrode 10 insulated from the n-type silicon carbide epitaxial layer 2 and the p-type base layer 6 by the gate insulating film 9 is formed in the trench. A part of the gate electrode 10 may protrude outside the trench.

In a surface layer on a first side (first main surface side of the silicon carbide semiconductor base) of the n-type silicon carbide epitaxial layer 2, opposite a second side of the n-type silicon carbide epitaxial layer 2 facing the n$^+$-type silicon carbide substrate 1, a first p$^+$-type base region (first base region of a second conductivity type) 3 and a second p$^+$-type base region (second base region of the second conductivity type) 4 are selectively provided. The second p$^+$-type base region 4 is formed under the trench and a width of the second p$^+$-type base region 4 is the same as or wider than a width of the trench. The first p$^+$-type base region 3 and second p$^+$-type base region 4 are doped with, for example, aluminum. A part of the first p$^+$-type base region 3 may be structured so as to extend toward the trench to be connected to the second p$^+$-type base region 4. The reason for this is that holes generated when avalanche breakdown occurs at a junction between the n-type silicon carbide epitaxial layer 2 and the second p$^+$-type base region 4 under the gate are efficiently migrated to a source electrode whereby load on the gate oxide film is decreased and reliability is improved.

On the first main surface side of the n-type silicon carbide epitaxial layer 2, the p-type base layer 6 is provided and in a first main surface side of the p-type base layer 6, an n$^+$-type source region 7 and a p$^{++}$-type contact region 8 are provided. Further, the n$^+$-type source region 7 and the p$^{++}$-type contact region 8 contact each other. In a region of the surface layer of the n-type silicon carbide epitaxial layer 2, between the first p$^+$-type base region 3 and the second p$^+$-type base region 4, and a region between the p-type base layer 6 and second p$^+$-type base region 4, the high-concentration n-type region 5 is provided. The high-concentration n-type region 5 is formed to a position deeper than that of the first p$^+$-type base region 3 and the second p$^+$-type base region 4.

In FIG. 1, while only two trench MOS structures are depicted, more trench MOS structures may be further arranged in parallel.

An interlayer insulating film 11 is provided on the entire first main surface side of the silicon carbide semiconductor base so as to cover the gate electrode 10 embedded in the trench. A source electrode 12 contacts the n$^+$-type source region 7 and the p$^+$-type contact region 8, via a contact hole opened in the interlayer insulating film 11. The source electrode 12 is electrically insulated from the gate electrode 10 by the interlayer insulating film 11. On the source electrode 12, a source electrode pad 14 is provided.

Figure 2:
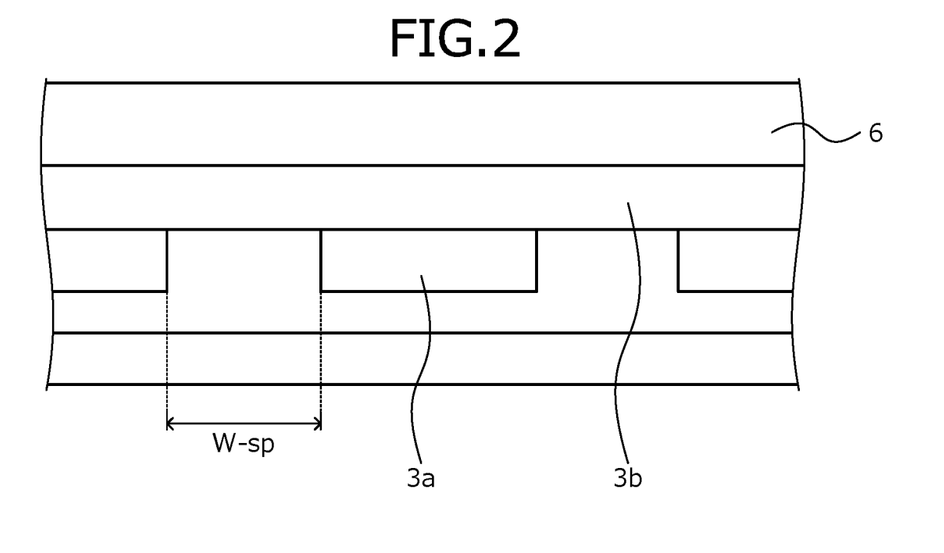
FIG. 2 is a side sectional view of the silicon carbide semiconductor device along a Y axis in FIG. 1, at cutting plane line A-A' in FIG. 1.
Figure 3:
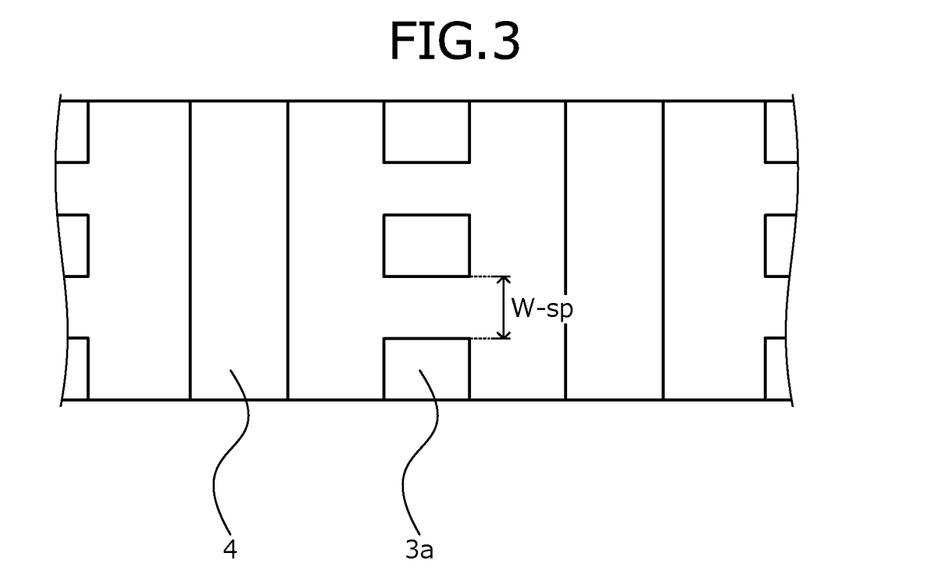
FIG. 3 is a planar sectional view of the silicon carbide semiconductor device cut parallel to a substrate surface along cutting plane line B-B' in FIG. 1.

Here, at least one part of the first p$^+$-type base region 3 has a region that is shallower than the second p$^+$-type base region 4. FIG. 2 is a side sectional view along a Y axis in FIG. 1, at cutting plane line A-A' in FIG. 1. In FIG. 2, the n$^+$-type silicon carbide substrate 1 and the p$^{++}$-type contact region on the element upper side are not depicted. FIG. 3 is a planar sectional view cut parallel to the substrate surface along cutting plane line B-B' in FIG. 1.

As depicted in FIGS. 2 and 3, the first p$^+$-type base region 3 has a deep first p$^+$-type base region (first region) 3a positioned at a same depth as a bottom of the second p$^+$-type base region 4 and a shallow first p$^+$-type base region (second region) 3b that is continuous and positioned at a depth shallower than that of the bottom of the second p$^+$-type base region 4. The deep first p$^+$-type base region 3a is formed in an island-like shape as viewed along the Y axis in FIG. 1. In other words, the first p$^+$-type base region 3 has in at least one part thereof, a region that is shallower than the second p$^+$-type base region 4 as viewed from the front surface of the substrate.

As a result, breakdown occurs more easily toward the first p-type base region 3 than at the second p$^+$-type base region 4, enabling the avalanche current that flows at the bottom of the trench to be suppressed and thus, enabling the avalanche capability to be secured.

Figure 4:
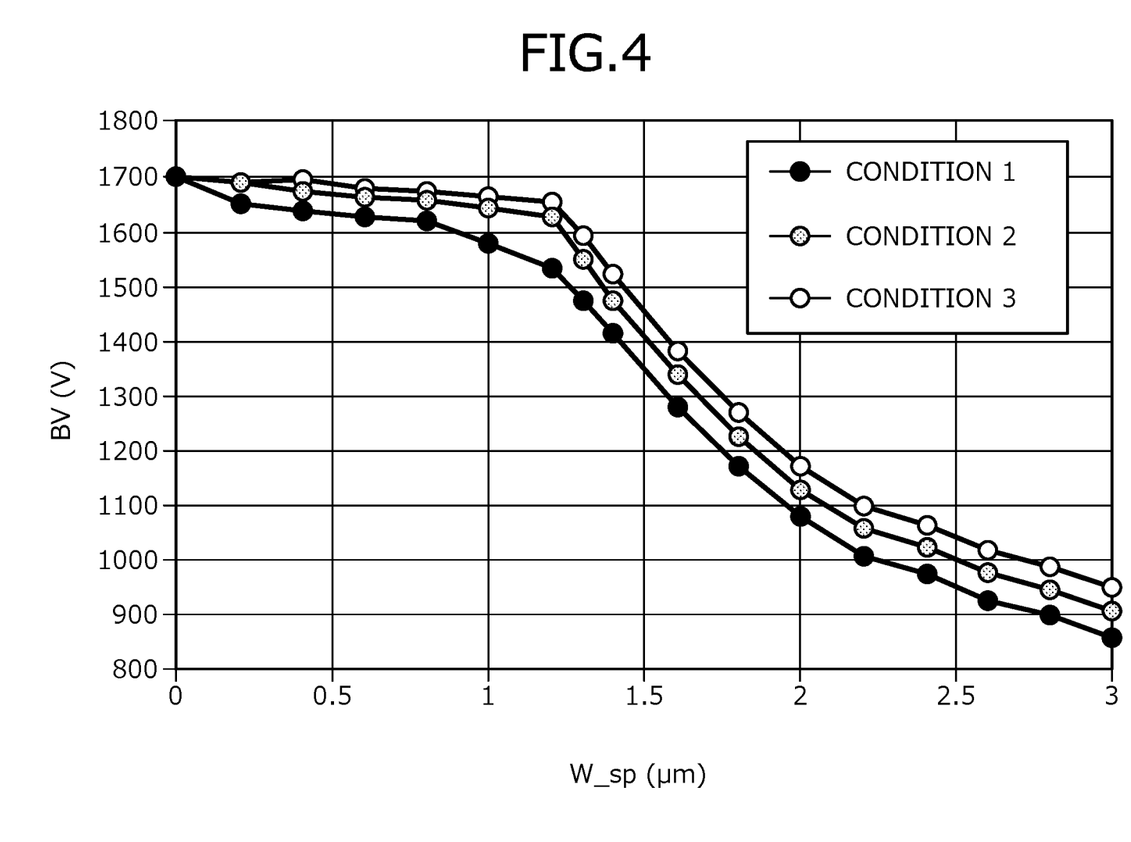
FIG. 4 is a graph depicting the relationship of breakdown voltage and the width of a shallow region in a part of a first $p^+$-type base region.

FIG. 4 is a graph depicting the relationship of breakdown voltage and the width of the shallow region in a part of the first p$^+$-type base region 3. The shallow region is formed in a part of the first p$^+$-type base region 3. The relationship of the width (W_sp) of the shallow region and breakdown voltage is depicted. While three different conditions (Conditions 1 to 3) were set for the p-type base concentration, it was found that irrespective of the conditions, the breakdown voltage of the first p$^+$-type base region 3 decreased by widening the width of the shallow region. Here, since the breakdown voltage of the second p$^+$-type base region 4 was about 1700V, as depicted in FIG. 4, by forming the shallow region, the breakdown voltage of the first p$^+$-type base region 3 becomes lower than that of the second p$^+$-type base region 4 and breakdown occurs toward the first p$^+$-type base region 3, enabling the avalanche current that flows at the bottom of the trench to be suppressed. In the case of this verification, it was found that preferably, the width (W_sp) of the shallow region of the first p$^+$-type base region 3 may be 0.2 μm or more and to obtain a breakdown voltage of 1200V, may be preferably 1.9 μm or less.

Figure 5:
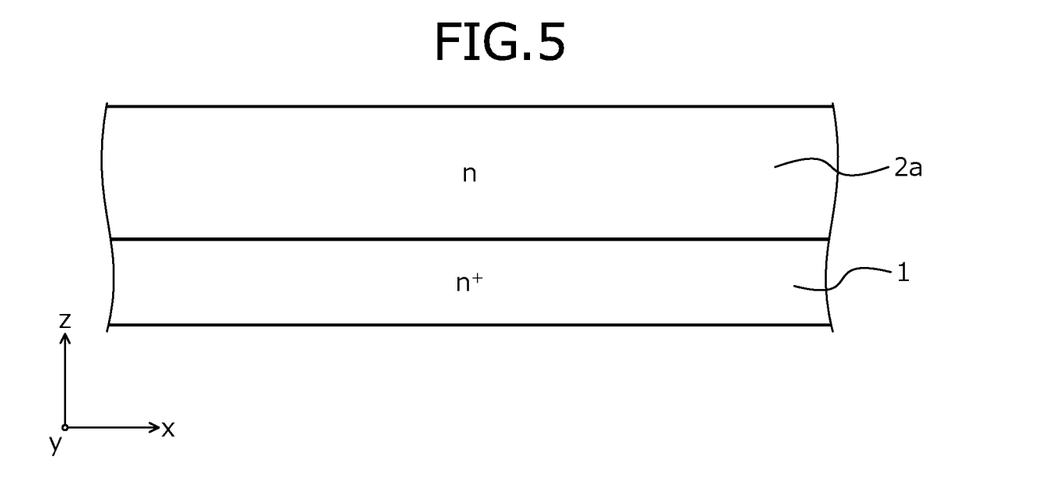
FIG. 5 is a cross-sectional view of the semiconductor device depicted in FIG. 1 during manufacture.

FIGS. 5, 6, 7, 8, 9, and 10 are cross-sectional views of the semiconductor device depicted in FIG. 1 during manufacture. Manufacturing processes will be described in the sequence of FIGS. 5, 6, 7, 8, 9, and 10. First, as depicted in FIG. 5, the n$^+$-type silicon carbide substrate 1 containing an n-type silicon carbide is prepared. On the first main surface of the n$^+$-type silicon carbide substrate 1, a first n-type silicon carbide epitaxial layer 2a containing silicon carbide is formed by epitaxial growth to have a thickness of, for example, about 10 μm while an n-type impurity, for example, nitrogen atoms, is doped. The state up to here is depicted in FIG. 5.

Figure 6:
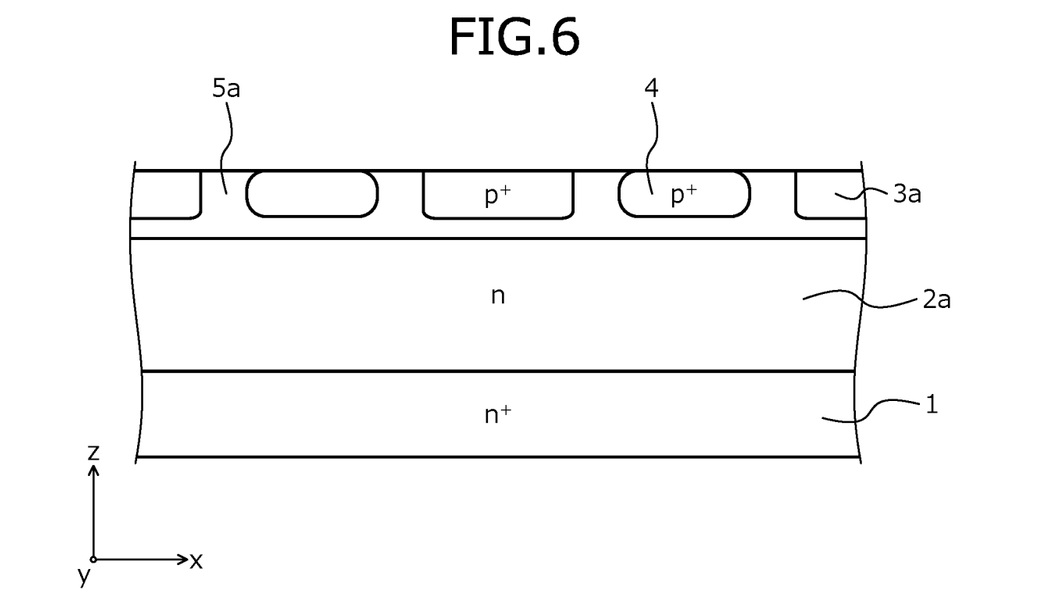
FIG. 6 is a cross-sectional view of the semiconductor device depicted in FIG. 1 during manufacture.

Next, as depicted in FIG. 6, on the surface of the first n-type silicon carbide epitaxial layer 2a, by photolithography, a mask (not depicted) having predetermined openings is formed using, for example, an oxide film. Subsequently, a p-type impurity, for example, aluminum ions, is ion implanted. As a result, as depicted in FIG. 6, in a part of a surface region of the first n-type silicon carbide epitaxial layer 2a, for example, the second p$^+$-type base region 4 and the deep first p$^+$-type base region 3a having a depth of, for example, about 0.5 μm are provided so that a distance between the deep first p$^+$-type base region 3a and the adjacent second p$^+$-type base region 4 is about 1 to 1.5 μm.

Here, formation is such that a mask of a part of the first p$^+$-type base region 3a remains and a non-implanted region is present in at least a part along the Y axis (FIG. 1) direction of the first p$^+$-type base region. The width (W_sp in FIGS. 2, 3) of the non-implanted region may be about 0.2 to 1.9 μm. Further, a dose amount during the ion implantation for forming the deep first p$^+$-type base region 3a and the second p$^+$-type base region 4 may set so that, for example, the impurity concentration becomes about $1\times10^{18}$ to $1\times10^{19}$/cm$^3$.

Next, the mask used during the ion implantation for forming the deep first p$^+$-type base region 3a and the second p$^+$-type base region 4 is removed. Subsequently, an n-type impurity, for example, nitrogen atoms, is ion implanted. As a result, as depicted in FIG. 6, in a part of a surface region of the first n-type silicon carbide epitaxial layer 2a, a deep high-concentration n-type region 5a is formed to a position that is deeper than the positions of the deep first p$^+$-type base region 3a and the second p-type base region 4. A dose amount during the ion implantation for forming the deep high-concentration n-type region 5a may be set so that, for example, the impurity concentration becomes about $5\times10^{16}$ to $5\times10^{17}$/cm$^3$. The state up to here is depicted in FIG. 6.

Figure 7:
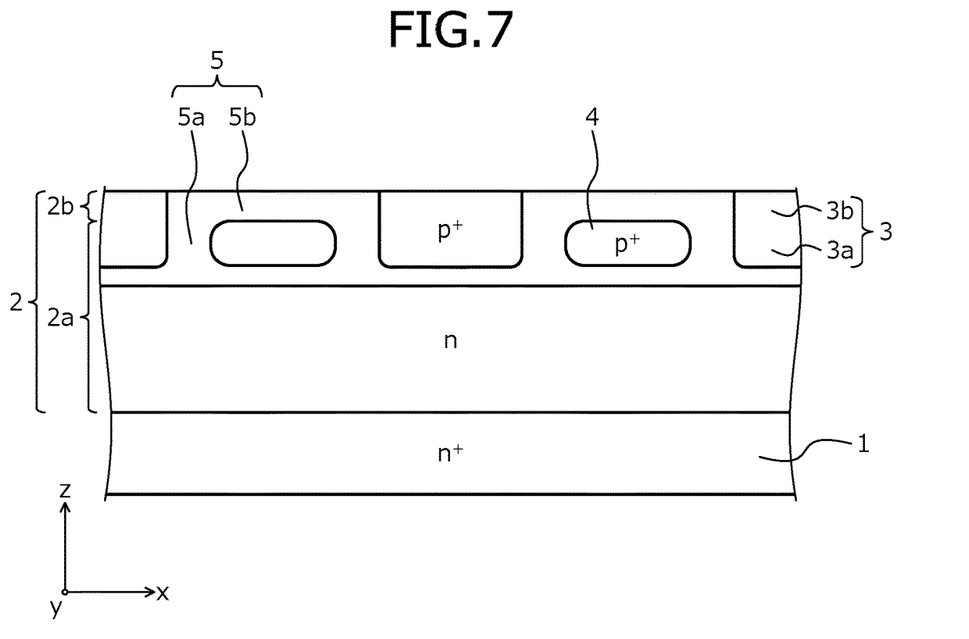
FIG. 7 is a cross-sectional view of the semiconductor device depicted in FIG. 1 during manufacture.

Subsequently, as depicted in FIG. 7, on the surface of the first n-type silicon carbide epitaxial layer 2a, a second n-type silicon carbide epitaxial layer 2b is formed by epitaxial growth to have a thickness of, for example, about 0.5 μm while an n-type impurity, for example, nitrogen atoms, is doped. The second n-type silicon carbide epitaxial layer 2b and the first n-type silicon carbide epitaxial layer 2a constitute the n-type silicon carbide epitaxial layer 2. Conditions of the epitaxial growth for forming the second n-type silicon carbide epitaxial layer 2b may be set so that, for example, the impurity concentration of the second n-type silicon carbide epitaxial layer 2b becomes about $8\times10^{15}$/cm$^3$.

Subsequently, on the surface of the n-type silicon carbide epitaxial layer 2, by photolithography, a mask (not depicted) having predetermined openings is formed using, for example, an oxide film. Next, a p-type impurity, for example, aluminum ions, is ion implanted. As a result, as depicted in FIG. 7, in a part of the surface region of the n-type silicon carbide epitaxial layer 2, for example, the shallow first p$^+$-type base region 3b at a depth of about 0.5 μm, for example, is formed overlapping a top of the deep first p$^+$-type base region 3a. The shallow first p-type base region 3b and the deep first p$^+$-type base region 3a constitute the first p$^+$-type base region 3. A dose amount during the ion implantation for forming the shallow first p$^+$-type base region 3b may be set so that, for example, the impurity concentration becomes about $1\times10^{18}$ to $1\times10^{19}$/cm$^3$.

Next, the mask used during the ion implantation for forming the shallow first p$^+$-type base region 3b is removed. Subsequently, an n-type impurity, for example, nitrogen atoms, is ion implanted. As a result, as depicted in FIG. 7, in a part of a surface region of the second n-type silicon carbide epitaxial layer 2b, for example, a shallow high-concentration n-type region 5b at a depth of about 0.5 μm is formed. A dose amount during the ion implantation for forming the shallow high-concentration n-type region 5b may be set so that, for example, the impurity concentration becomes about $5\times10^{16}$ to $5\times10^{17}$/cm$^3$. The high-concentration n-type region (second region) 5b and the high-concentration n-type region (first region) 5a constitute the high-concentration n-type region 5. The state up to here is depicted in FIG. 7.

Next, on the surface of the n-type silicon carbide epitaxial layer 2, the p-type base layer 6 is formed by epitaxial growth to have a thickness of, for example, about 0.7 to 1.3 μm while a p-type impurity, for example, aluminum ions, is doped. Conditions of the epitaxial growth for forming the p-type base layer 6 may set so that, for example, the impurity concentration becomes about $1\times10^{16}$ to $5\times10^{18}$/cm$^3$.

Figure 8:
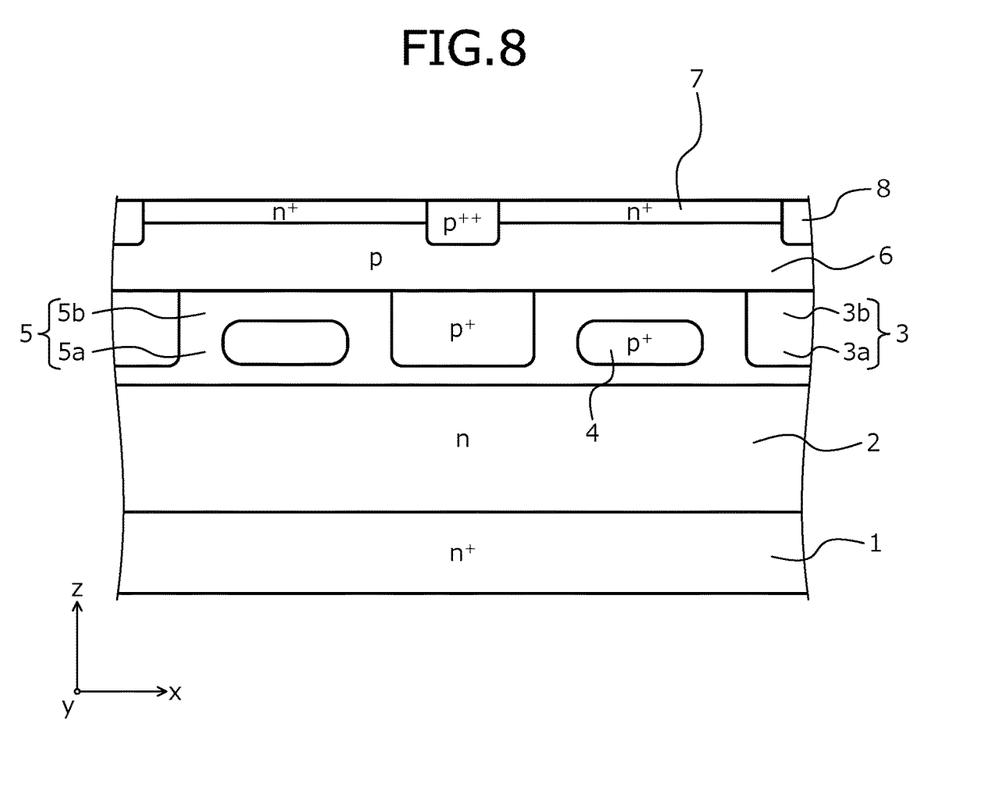
FIG. 8 is a cross-sectional view of the semiconductor device depicted in FIG. 1 during manufacture.

Next, on the surface of the exposed p-type base layer 6, by photolithography, a mask (not depicted) having predetermined openings is formed using, for example, an oxide film. Subsequently, an n-type impurity, for example, phosphorus, is ion implanted. As a result, as depicted in FIG. 8, in a part of a surface region of the p-type base layer 6, the n$^+$-type source region 7 is formed. A dose amount during the ion implantation for forming the n$^+$-type source region 7 may be set so that, for example, the impurity concentration becomes higher than that of the first p$^+$-type base region 3.

Next, the mask used during the ion implantation for forming the n$^+$-type source region 7 is removed. Subsequently, on the surface of the exposed p-type base layer 6, by photolithography, a mask (not depicted) having predetermined openings is formed using, for example, an oxide film, and in the surface of the p-type base layer 6, a p-type impurity, for example, aluminum, is ion implanted. As a result, as depicted in FIG. 8, in a part of a surface region of the p-type base layer 6, the p$^{++}$-type contact region 8 is formed. A dose amount during the ion implantation for forming the p$^{++}$-type contact region 8 may be set so that, for example, the impurity concentration becomes higher than that of the second p$^+$-type base region 4. Subsequently, the mask used during the ion implantation for forming the p$^{++}$-type contact region 8 is removed. The state up to here is depicted in FIG. 8.

Next, heat treatment (annealing) is performed and, for example, the first p$^+$-type base region 3, the second p$^+$-type base region 4, the n$^+$-type source region 7, and the p$^{++}$-type contact region 8 are activated. A temperature of the heat treatment may be, for example, about 1700 degrees C. The period of the heat treatment may be, for example, about 2 minutes. As described, ion implanted regions may be collectively activated by a single heat treatment session or heat treatment may be performed for activation each time the ion implantation is performed.

Figure 9:
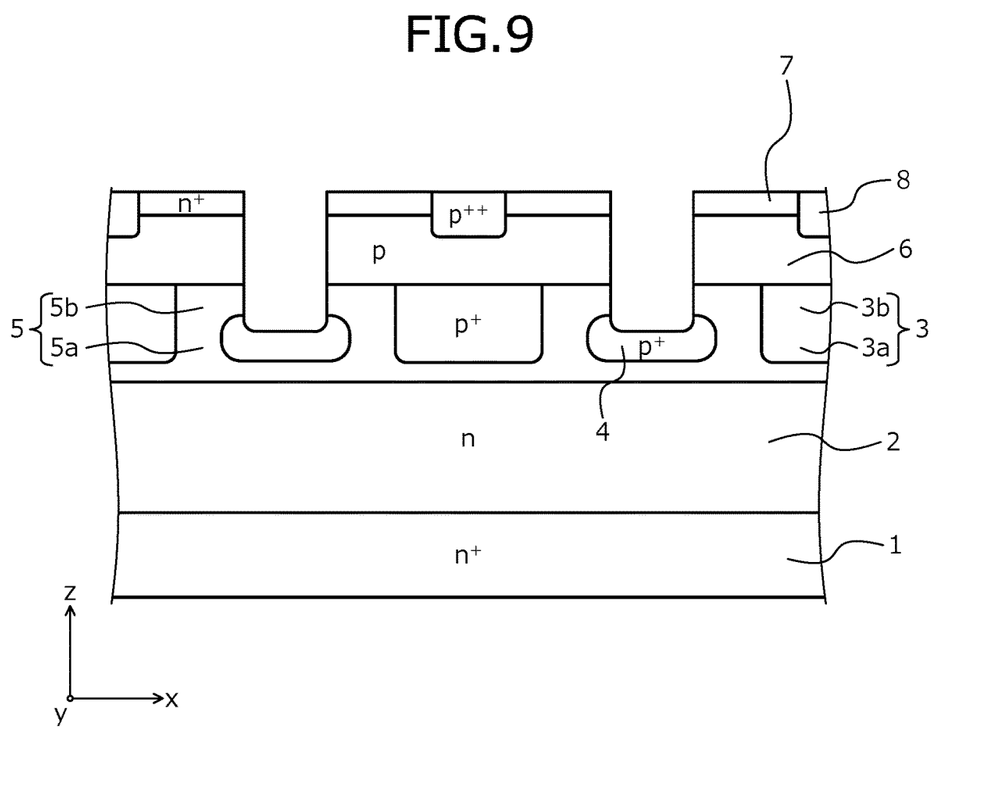
FIG. 9 is a cross-sectional view of the semiconductor device depicted in FIG. 1 during manufacture.

Next, as depicted in FIG. 9, on the surface of the exposed p-type base layer 6, by photolithography, a mask (not depicted) having predetermined openings is formed using, for example, an oxide film. Subsequently, by dry etching, trenches are formed penetrating the p-type base layer 6 and reaching the n-type silicon carbide epitaxial layer 2. The bottoms of the trenches may reach the second p$^+$-type base region 4 or may be provided in the n-type silicon carbide epitaxial layer 2 between the p-type base layer 6 and second p$^+$-type base region 4. Next, the mask used for forming the trenches is removed. The state up to here is depicted in FIG. 9.

Figure 10:
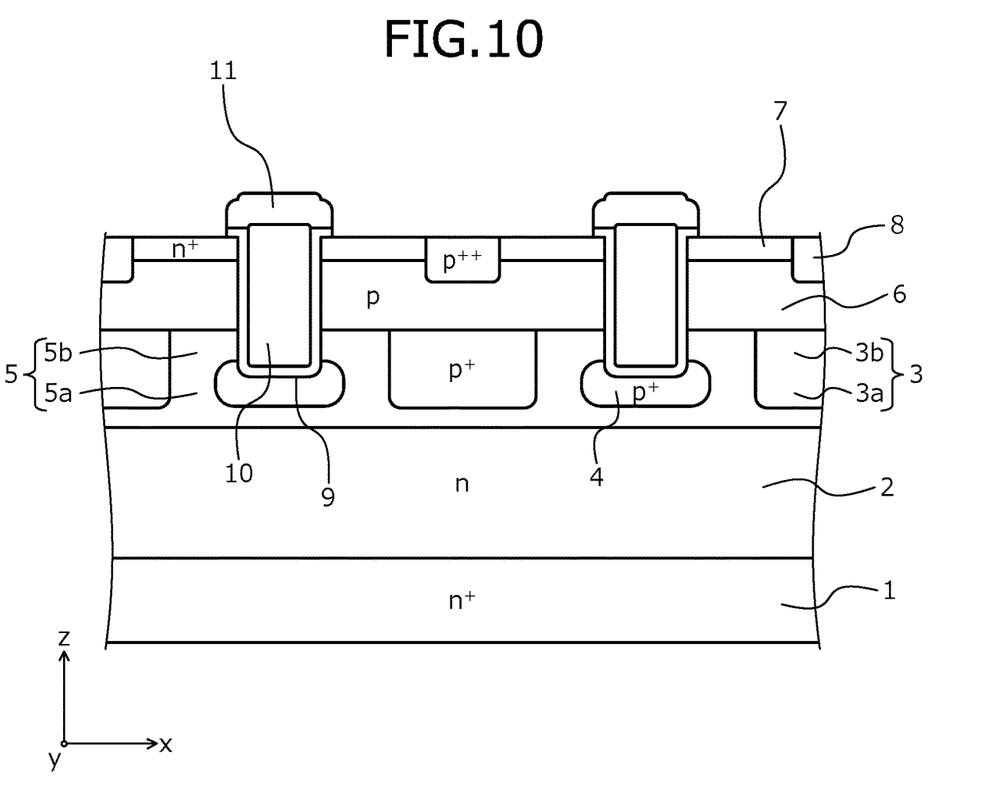
FIG. 10 is a cross-sectional view of the semiconductor device depicted in FIG. 1 during manufacture.

Next, as depicted in FIG. 10, the gate insulating film 9 is formed along the surfaces of trenches, on the sides and the bottoms of the trenches, the n$^+$-type source region 7, and the p$^{++}$-type contact region 8. The gate insulating film 9 may be formed by thermal oxidation by heat treatment at a temperature of about 1000 degrees C. in an oxygen atmosphere. Further, the oxide film may be formed by a method of deposition by a chemical reaction such as High Temperature Oxidation (HTO).

Next, on the gate insulating film 9, a polycrystalline silicon layer doped with, for example, phosphorus atoms, is formed. The polycrystalline silicon layer may be formed so as to be embedded in the trenches. The polycrystalline silicon layer is patterned so that the parts in the trenches remain whereby the gate electrodes 10 are formed. A part of the gate electrodes 10 may protrude outside the trenches.

Next, for example, phosphate glass is deposited so as to cover the gate insulating film 9 and the gate electrode 10, and have a thickness of about 1 μm to thereby form the interlayer insulating film 11. The interlayer insulating film 11 and the gate insulating film 9 are patterned and selectively removed whereby contact holes are formed, exposing the n$^+$-type source region 7 and the p$^{++}$-type contact region 8. Thereafter, heat treatment (reflow) is performed, planarizing the interlayer insulating film 11. The state up to here is depicted in FIG. 10.

Next, in the contact holes and on the interlayer insulating film 11, a conductive film constituting the source electrode 12 is formed. The conductive film is selectively removed, for example, leaving the source electrode 12 only in the contact holes.

Next, on a second main surface of the n$^+$-type silicon carbide substrate 1, for example, the drain electrode 13 is formed using a nickel film. Thereafter, for example, heat treatment at a temperature of about 970 degrees C. is performed, forming an ohmic junction between the n$^+$-type silicon carbide substrate 1 and the drain electrode 13.

Next, as depicted in FIG. 1, for example, an aluminum film having a thickness of, for example, about 5 μm is formed by, for example, sputtering, so as to cover the source electrode 12 and the interlayer insulating film 11. Thereafter, the aluminum film is selectively removed so as to leave the aluminum film covering the active region of the element overall and thereby form the source electrode pad 14.

Next, on the surface of the drain electrode 13, for example, titanium, nickel, and gold are sequentially deposited whereby a drain electrode pad 15 is formed. In this manner, the semiconductor device depicted in FIG. 1 is completed.

In the embodiments, while formation of the shallow high-concentration n-type region 5b has been described to be by ion implantation, this ion implantation may be omitted in the method of manufacture by setting conditions of the epitaxial growth for the second n-type silicon carbide epitaxial layer 2b so that the impurity concentration of nitrogen becomes about $5 \times 10^{16}$ to $5 \times 10^{17}$/cm$^3$.

In the embodiments, while a case where a main surface of a substrate containing silicon carbide is a (0001) plane and on the (0001) plane a MOS is formed has been described as an example, configuration is not limited hereto and various modifications are possible related to, for example, the wide bandgap semiconductor, the orientation of the main surface of the substrate, and the like.

Further, in the embodiments, while a first conductivity type is assumed to be an n-type and the second conductivity type is assumed to be a p-type, the present invention is similarly implemented when the first conductivity type is a p-type and the second conductivity type is an n-type.

According to the structure above, the electric field strength at the gate oxide film at the bottom of the trench is mitigated, securing the breakdown voltage of the active region; and the avalanche current that flows at the bottom of the trench during breakdown is suppressed, enabling the avalanche capability of the elements to be secured. Further, the structure is simple and may be easily formed.

According to the embodiments, an effect is achieved in that avalanche breakdown voltage may be secured by a simple structure.

As described, the semiconductor device according to the present invention is useful for high-voltage silicon carbide semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a wide bandgap semiconductor substrate of a first conductivity type having a first impurity concentration and having a front surface and a rear surface;
   a first wide bandgap semiconductor layer of the first conductivity type having a second impurity concentration higher than the first impurity concentration and having a first side and a second side, formed on the front surface of the wide bandgap semiconductor substrate of the first conductivity type having the first impurity concentration; and
   an element structure including:
   a first-conductivity-type region selectively formed in the surface of the first wide bandgap semiconductor layer of the first conductivity type, the first-conductivity-type region having an impurity concentration that is higher than that of the first wide bandgap semiconductor layer of the first conductivity type;
   a first base region of a second conductivity type selectively formed in a surface of the first conductivity type region;
   a second base region of a second conductivity type selectively formed in the first conductivity type region;
   a wide bandgap semiconductor layer of the second conductivity type formed on the surface of the first side of the first wide bandgap semiconductor layer of the first conductivity type, opposite the second side of the first wide bandgap semiconductor layer of the first conductivity type facing the wide bandgap semiconductor substrate;
   a source region of the first conductivity type selectively formed in a surface layer of the wide bandgap semiconductor layer of the second conductivity type;
   a contact region of the second conductivity type; and
   a trench penetrating the wide bandgap semiconductor layer of the second conductivity type and formed shallower than the second base region, wherein, the first base region of the second conductivity type, as viewed from an upper surface of the wide bandgap semiconductor layer of the second conductivity type, is separated from the second base region of the second conductivity type in a first direction and has a shallow bottom region and a plurality of deep bottom regions below the shallow bottom region that both extend in a second direction perpendicular to the first direction, and wherein the shallow bottom region extends continuously across the plurality of deep bottom regions and a distance between adjacent deep bottom regions ranges from 0.2 µm to 1.9 µm along said second direction.

2. The semiconductor device according to claim 1, wherein the first base region and the second base region have respective impurity concentrations that are the same.

3. The semiconductor device according to claim 1, wherein the first base region has a region excluding the shallow bottom region, and wherein the second base region directly contacts the first base region at the region of the first base region excluding the shallow bottom region of the first base region.

4. The semiconductor device according to claim 1, wherein the wide bandgap semiconductor substrate contains silicon carbide.

5. The semiconductor device according to claim 1, further comprising:

a gate insulating film formed along surfaces of the trench including at a bottom and sides of the trench, the first wide bandgap semiconductor layer of the first conductivity type and the wide bandgap semiconductor layer of the second conductivity type being insulated by the gate insulating film;

a gate electrode, at least a part of which is formed in the trench;

an interlayer insulating film formed on the gate electrode;

a source electrode commonly contacting surfaces of the source region and the contact region; and a drain electrode formed on the rear surface of the wide bandgap semiconductor substrate.

* * * * *